(12) United States Patent
Yamazoe

(10) Patent No.: US 7,777,881 B2
(45) Date of Patent: Aug. 17, 2010

(54) LASER DEVICE AND MICROSCOPE

(75) Inventor: Shogo Yamazoe, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/401,631

(22) Filed: Mar. 11, 2009

(65) Prior Publication Data

US 2009/0237661 A1    Sep. 24, 2009

(30) Foreign Application Priority Data

Mar. 21, 2008   (JP) ............................. 2008-074126

(51) Int. Cl.
*G01J 4/00* (2006.01)
(52) U.S. Cl. ........................................ 356/364; 372/27
(58) Field of Classification Search ................. 356/364; 372/18, 106, 27, 29.014, 39, 44.011, 92
See application file for complete search history.

(56) References Cited

U.S. PATENT DOCUMENTS 6,009,114 A    12/1999   Heller et al.
6,754,249 B2 *   6/2004   Schmid et al. .............. 372/106
2005/0224706 A1 *  10/2005   von Rosenberg, Jr. ....... 250/234

FOREIGN PATENT DOCUMENTS

JP    2007-281388    10/2007

* cited by examiner

*Primary Examiner*—Tarifur Chowdhury
*Assistant Examiner*—Abdullahi Nur
(74) *Attorney, Agent, or Firm*—Solaris Intellectual Property Group, PLLC

(57) ABSTRACT

A laser device is equipped with an exciting optical system having a GaN semiconductor laser and a condensing lens; and a resonator having of a dichroic mirror and an output mirror, and a solid laser medium is disposed within the resonator. The solid laser medium is disposed in the resonator such that the c axis of a crystal is parallel to the x axis. The exciting optical system is disposed such that the direction in which excitation light emitted from the GaN semiconductor laser is polarized is parallel to the y axis, and is formed so as to absorb excitation light in the crystal axis perpendicular to the c axis. The direction in which the oscillation light emitted from the solid laser medium is polarized coincides with a direction parallel to the c-axis direction, and also coincides with a direction along the x axis.

10 Claims, 6 Drawing Sheets

LASER DEVICE AND MICROSCOPE

CROSS-REFERENCE TO RELATED APPLICATION

This application claims priority under 35 USC 119 from Japanese Patent Application No. 2008-074126, the disclosure of which is incorporated by reference herein.

BACKGROUND OF THE INVENTION

1. Field of the Invention

The present invention relates to a laser device and a microscope, and particularly to a laser device having, in a resonator, a solid laser medium that emits light by receiving excitation light from an excitation unit, and also to a microscope.

2. Description of the Related Art

Conventionally, a solid laser medium to which a transition metal ion such as Ti:S, Cr:BeAl$_2$O$_4$, Cr:LiSAF or the like is added, has a very wide fluorescence band of 100 nm or greater, and has been frequently used as a solid laser medium for a variable wavelength laser or an ultra-short pulse laser.

These solid laser media each having a transition metal ion added thereto have large absorption in a visible wavelength region. The solid laser medium having Ti:S added thereto (a Ti:S laser) is excited by an argon laser (wavelength: 488 nm to 514 nm) or a solid laser that oscillates a second harmonic wave (wavelength: 532 nm) of a fundamental wave of Nd:YVO$_4$ (wavelength: 1064 nm).

However, these excitation light sources each have a large size and a high cost, which in turn becomes a large factor of causing a large-size and high-cost Ti—S laser to be produced. To the contrary, a solid laser medium having a doped Cr$^{3+}$ ion, such as Cr:BeAl$_2$O$_4$, Cr:LiSAF or the like has a large absorption peak in the wavelength region in the vicinity of 650 nm, and allows excitation with a red semiconductor laser for DVD. For example, U.S. Pat. No. 6,009,114 discloses the technique that a solid laser medium having a transition metal ion added thereto is excited with a semiconductor laser in the region of visible light.

Accordingly, by means of these solid laser media, a small-size and low-cost variable wavelength laser or ultra-short pulse laser can be realized.

However, the limit output of the red semiconductor laser for a DVD is 300 mW or thereabouts in the existing circumstances, and this level of output is sufficient for the laser for a DVD. Therefore, no increase of the output can be expected in the future. For this reason, in the cases of the variable-wavelength laser or ultra-short pulse laser using the solid laser medium having a Cr$^{3+}$ ion added thereto by means of a red semiconductor laser excitation, there is a limitation to the output of the laser.

The solid laser medium with a Cr$^{3+}$ ion doped has two or three large absorption peaks in the region of visible wavelength, and also has an absorption peak that exists even in the wavelength region of 500 nm or less. These regions each have the same wavelength of GaN semiconductor laser that has been improved so as to have a high output laser in recent years. Accordingly, by means of the high-output GaN semiconductor laser, high-output variable-wavelength laser or ultra-short pulse laser can be obtained, but such laser devices have not been proposed yet.

For example, Japanese Patent Application Laid-Open (JP-A) No. 2007-281388 discloses a technique that respective polarized lights of excitation light and oscillation light are made to intersect each other, a direction in which excitation light is polarized is set so as to increase light absorption, and a direction in which oscillation light is polarized is set so as to widen a band of fluorescence, thereby allowing achievement of efficient wide-band laser oscillation.

However, in the technique disclosed in JP-A No. 2007-281388 as described above, a semiconductor laser in the region of visible light is not used as an excitation light source, and therefore, the above-described GaN semiconductor laser cannot be used as the excitation light source, and it is difficult to configure a high-output variable-wavelength laser or ultra-short pulse laser.

SUMMARY OF THE INVENTION

The present invention has been achieved in view of the aforementioned circumstances, and provides a high-output laser device using an excitation light source in the region of visible light, and a microscope.

A laser device according to a first aspect of the present invention is a laser device including: a resonator; a solid laser medium that is disposed in the resonator and that outputs, as oscillation light, linear polarized light polarized in a direction parallel to a first crystal axis due to excitation light being made incident thereon; and an exciting unit that allows the excitation light to be made incident on the solid laser medium, which excitation light is linear polarized light having a wavelength in a blue region and is polarized in a direction intersecting the first crystal axis of the solid laser medium, wherein an absorption intensity of the excitation light in the solid laser medium in the direction in which the excitation light is polarized is larger than that of the excitation light in the direction parallel to the first crystal axis, and a light emission intensity in a predetermined oscillation wavelength region in regard to the direction parallel to the first crystal axis is larger than the light emission intensity in the direction in which the excitation light is polarized.

In accordance with the first aspect of the present invention, the exciting unit causes excitation light that is linear polarized light having a wavelength in a blue laser region, i.e., a visible light region, which polarized light is polarized in a direction intersecting the first crystal axis of the solid laser medium, to be made incident on the solid laser medium. The solid laser medium outputs, as oscillation light, the linear polarized light that is polarized in a direction parallel to the first crystal axis due to the excitation light from the exciting unit being made incident thereon.

The first aspect of the present invention is constructed in such a manner that an absorption intensity of the excitation light in the solid laser medium in the direction in which the excitation light is polarized is larger than that of the excitation light in the direction parallel to the first crystal axis, and a light emission intensity in a predetermined oscillation wavelength region in regard to the direction parallel to the first crystal axis is larger than the light emission intensity in the direction in which the excitation light is polarized.

Accordingly, in the first aspect of the present invention, the above-described exciting unit can have a structure including a semiconductor laser comprised of GaN, and a low-cost and small-size high output laser device can be provided.

The blue laser wavelength is in the range of, for example, 350 nm to 500 nm, and the predetermined oscillation wavelength region is in the range of, for example, 700 nm to 1000 nm. Further, the direction parallel to the first crystal axis includes a direction substantially parallel to the first crystal axis.

Further, preferably, the direction in which the excitation light is polarized coincides with a direction parallel to a second crystal axis and orthogonal to the first crystal axis of the solid laser medium, and the absorption intensity of the excitation light in regard to the direction parallel to the second crystal axis in the solid laser medium is the maximum value of the absorption intensity of the excitation light in each of the crystal axes.

In the first aspect of the present invention, preferably, the solid laser medium is a solid laser medium having a $Cr^{3+}$ ion added thereto.

Further, in the first aspect of the present invention, preferably, the solid laser medium may includes one selected from the group consisting of alexandrite ($Cr:BeAl_2O_4$), Cr:LiCAF ($LiCaAlF_6$), Cr:LiSAF ($LiSrAlF_6$), and Cr:LiSGAF ($LiSrGaF_6$).

In the first aspect of the present invention, preferably, the wavelength of the excitation light coincides with an excitation absorption wavelength from a $^4A_2$ normal level to a $^4T_1$ level.

Moreover, in the first aspect of the present invention, preferably, the exciting unit includes a semiconductor laser made from GaN.

In the first aspect of the present invention, preferably, a wavelength control element that controls an oscillation wavelength of the oscillation light may be disposed in the resonator.

In the first aspect of the present invention, preferably, a mode-locking device for inducing mode-locking may be disposed in the resonator.

Further, in the first aspect of the present invention, preferably, the mode-locking device may be formed as a semiconductor saturable absorber mirror device.

A microscope that includes: the laser device of the first aspect of the present invention; and an optical system that condenses laser light from the laser device into an object to be measured, and applies the laser light to the object; and a detecting unit that condenses return light from the object to be measured, and detects the light, is provided.

According to the present invention, due to the laser device of the first aspect of the present invention being used as the light source, a low-cost and small-size microscope can be achieved.

As described above, the present invention has an excellent effect of making it possible to provide a high-output laser device using an excitation light source having a visible light region.

DETAILED DESCRIPTION OF THE INVENTION

An embodiment of the present invention will be hereinafter described in detail with reference to the attached drawings.

First Embodiment

First, the first embodiment of the present invention is described.

As previously described, a $Cr^{3+}$ ion-doped solid laser medium has two or three large absorption peaks in the visible wavelength region, and also has an absorption peak even in the region of wavelength of 500 nm or less. For this reason, use of high-output GaN semiconductor lasers whose oscillation wavelengths coincide with one another, a variable-wavelength laser or an ultra-short pulse laser becomes possible.

The present inventors found that in a case in which the GaN semiconductor laser is used as an excitation light source, the GaN semiconductor laser has an excitation structure different from that of a red semiconductor laser due to the following reasons, thereby making it possible to carry out laser oscillation efficiently (high-output laser oscillation).

Figure 1:
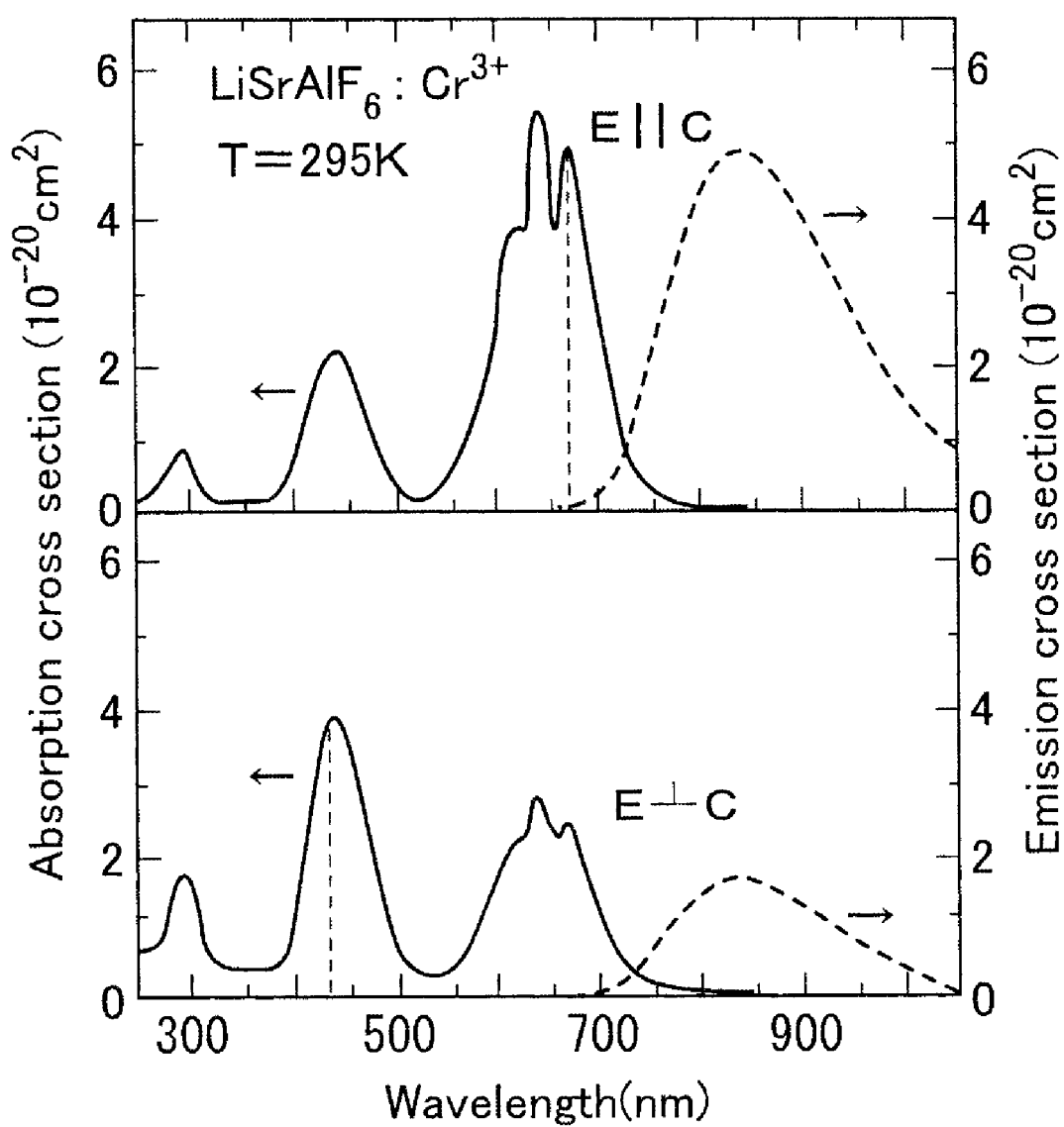
FIG. 1 is a diagram showing fluorescence/absorption spectra of Cr:LiSAF.

FIG. 1 shows fluorescence/absorption spectra of Cr:LiSAF. The graph shown at the upper side of this drawing represents the relationship between the wavelength in a direction parallel to c axis (first crystal axis) of a crystal axis, and each of the absorption cross section and the fluorescence cross section. The graph shown at the lower side represents the relationship between the wavelength in a direction orthogonal to the c axis, and each of the absorption cross section (absorption intensity) and the fluorescence cross section (fluorescence intensity). In these graphs, the fluorescence spectrum is indicated by a broken line and the absorption spectrum is indicated by the solid line.

As shown in FIG. 1, the fluorescence spectrum indicates the greatest fluorescence intensity in the direction parallel to the c axis. To the contrary, in the case of the absorption spectrum, the absorption intensity in the region of the wavelength in the vicinity of 650 nm, that is, in the oscillation wavelength region of the red semiconductor laser (excitation from the normal level $^4A_2$ to the $^4T_2$ level band) indicates the greatest value in the direction parallel to the c axis, but the absorption intensity in the region of the wavelength in the vicinity of 450 nm, that is, in the oscillation wavelength region of the GaN semiconductor laser (excitation from the normal level $^4A_2$ to the $^4T_1$ level band) indicates the greatest value in the direction perpendicular to the c axis. From these facts, in a case in which a $Cr^{3+}$ ion-added solid laser medium is excited with the GaN semiconductor laser, the direction in which oscillation light is polarized is set in the direction parallel to the c axis, and the direction in which excitation light is polarized is set in the direction perpendicular to the c axis, thereby allowing efficient oscillation to be realized.

Figure 2:
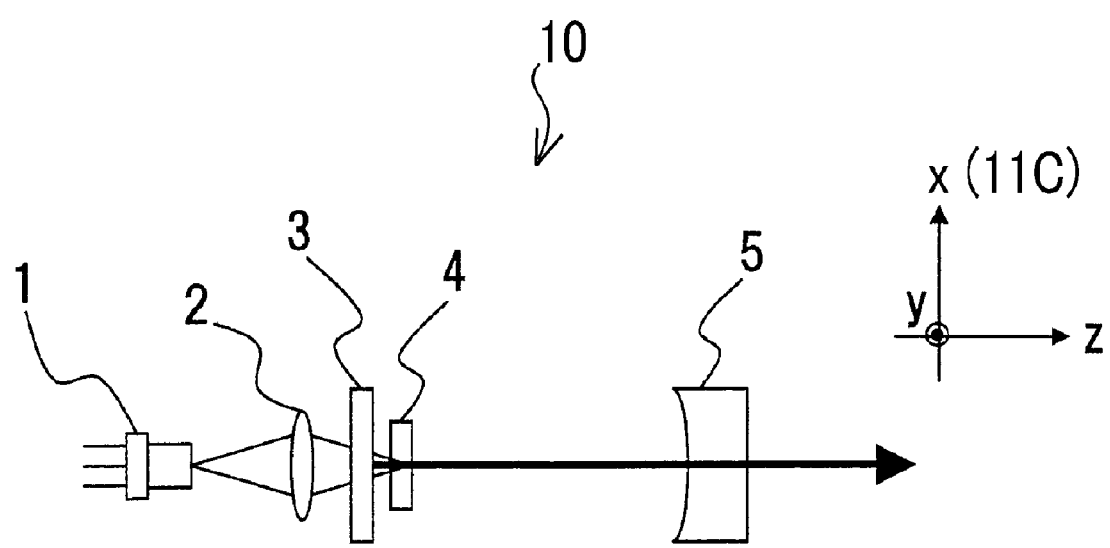
FIG. 2 is a schematic structural diagram of a laser device according to a first embodiment.

FIG. 2 shows a schematic structure of a laser device 10 according to the present embodiment.

The laser device 10 includes, by way of example, a GaN semiconductor laser 1 having a wavelength of 445 nm and an output of 500 mW (for example, produced by Nichia Corporation, model number: NDB7112E), and a condensing lens 2 (for example, a fiber coupler lens for a blue-violet laser produced by Alps Electric Co., Ltd.).

Further, the laser device 10 has a structure having a resonator comprised of a dichroic mirror 3 and an output mirror 5, and also having a solid laser medium 4 disposed in the resonator. The solid laser medium 4 is, in the present embodiment, a Cr:LiSAF crystal as an example, but the present invention is not limited to the same and any one of alexandrite (Cr:$BeAl_2O_4$), Cr:LiCAF (LiCaAlF$_6$), and Cr:LiSGAF (LiSrGaF$_6$) may also be used. These materials have substantially the same fluorescence/absorption spectra as those of Cr:LiSAF.

The dichroic mirror 3 is coated with dichroic coating such that the reflectivity thereof is 5% or less in regard to light having a wavelength of 445 nm±5 nm and the reflectivity thereof is 99% or more in regard to light having a wavelength of 800 nm to 900 nm.

As the solid laser medium 4, for example, a crystal having a crystal length of 2.5 mm, with 3% of Cr being added thereto, is used. Both end surfaces of the solid laser medium are coated with anti-reflection coating such that the reflectivity thereof is 5% or less in regard to light in the wavelength range of 445 nm±5 nm and the reflectivity thereof is 0.2% or less in regard to light in the wavelength range of 800 nm to 900 nm. The c axis of the crystal is disposed in the resonator such that the c axis of the crystal is disposed in parallel to the x axis shown in FIG. 2.

Further, the solid laser medium 4 is fixed by, by way of example, a copper holder (not shown) whose temperature is adjusted by a Peltier device (not shown), and the temperature thereof is adjusted at about 15° C.

The output mirror 5 has a curvature radius of, for example, 50 mm. The concave surface of the mirror is coated such that the reflectivity thereof is 98.5% in regard to light having a wavelength in the range of 800 nm to 900 nm. The planar surface of the mirror at the side opposite to the concave surface is coated with anti-reflection coating such that the reflectivity thereof is 0.1% or less in regard to light having a wavelength in the range of 800 nm to 900 nm.

The aforementioned exciting optical system is disposed so that the direction in which excitation light emitted from the GaN semiconductor laser 1 is polarized is parallel with the y axis (second crystal axis) shown in FIG. 2, and also has a structure that allows excitation light to be absorbed in the crystal axis which is perpendicular to the c axis and on which absorption of excitation light having a wavelength of 445 nm is maximum.

On the other hand, the direction in which oscillation light emitted from the solid laser medium 4 is polarized coincides with a direction parallel to the c axis direction, on which the fluorescence intensity is maximum, which direction is orthogonal to the excitation light, that is to say, it coincides with a direction parallel to the x axis shown in FIG. 2.

In this way, the laser device 10 according to the present embodiment can provide a high-output laser device using a GaN semiconductor laser 1 that is an excitation light source in the region of visible light.

The laser device 10 as described above can obtain output of laser light having a wavelength of 850 nm and an output of 110 mW in regard to, for example, the output of 500 mW of excitation light emitted from the GaN semiconductor laser 1.

Second Embodiment

Next, a second embodiment of the present invention is described. Note that the same parts as those of the first embodiment should be denoted by the same reference numerals, respectively, and a detailed description thereof is omitted.

Figure 3:
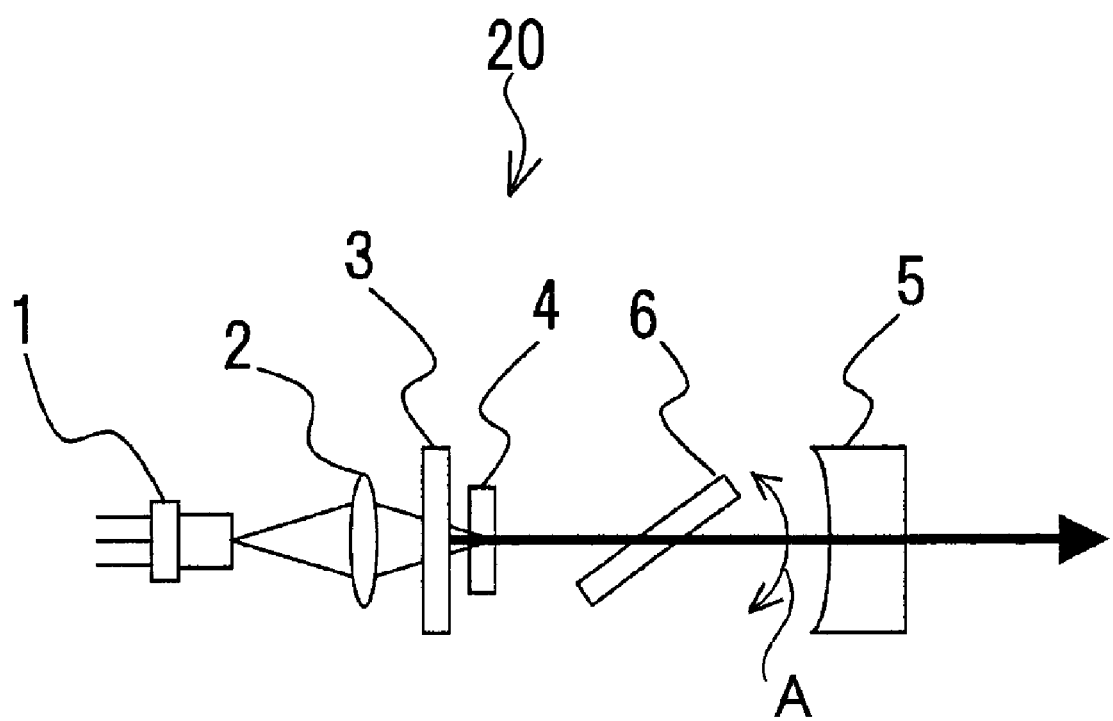
FIG. 3 is a schematic structural diagram of a laser device according to a second embodiment.

FIG. 3 shows the schematic structure of a laser device 20 according to the second embodiment of the present invention. The laser device 20 is different from the laser device 10 shown in FIG. 2 in that the laser device 20 includes, as one example, a quartz plate 6 having a thickness of 100 μm, between the solid laser medium 4 and the output mirror 5, and in that the coating applied on the concave surface of the output mirror 5 is one whose reflectivity is 99.5% in regard to light having a wavelength in the range of 800 nm to 900 nm.

In the laser device 20 having the aforementioned structure, the quartz plate 6 is rotated in directions indicated by the double-headed arrow A in FIG. 3 so that the angle thereof may be adjusted, thereby allowing the oscillation wavelength of laser light outputted from the laser device 20 to be controlled. In other words, the quartz plate 6 functions as a wavelength control element, and therefore, it is possible to output laser light having a desired wavelength by adjusting the angle of the quartz plate 6 so as to have a desired wavelength.

In accordance with the laser device 20 having the aforementioned structure, by way of example, the angle of the quartz plate 6 is adjusted so that the oscillation wavelength of laser light is 800 nm to 900 nm, and the oscillation output of 30 mW or more can be obtained.

In the laser device 20 according to the present embodiment, an etalon filter such as the quartz plate 6 is used as the wavelength control element. However, using a double refraction filter in place of the etalon filter, wavelength control may also be carried out without changing the optical axis of the resonator.

Third Embodiment

Next, a third embodiment of the present invention is described. Note that the same parts as those of the first embodiment should be denoted by the same reference numerals, respectively, and a detailed description thereof is omitted.

Figure 4:
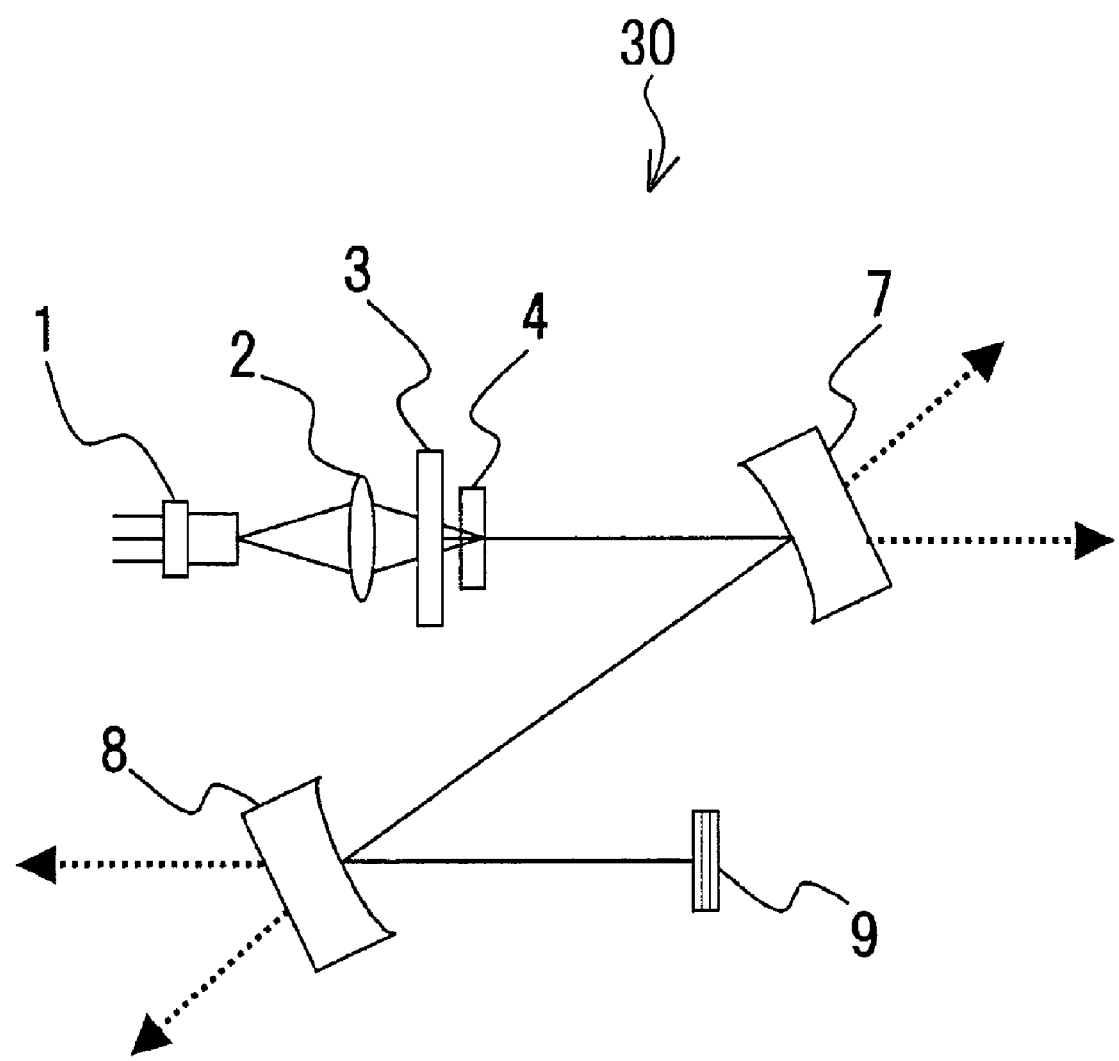
FIG. 4 is a schematic structural diagram of a laser device according to a third embodiment.

FIG. 4 shows the schematic structure of a laser device 30 according to the third embodiment. The laser device 30 is different from the laser device 10 shown in FIG. 2 in that in place of the output mirror 5, resonator mirrors 7, 8, and a semiconductor saturable absorber mirror 9 are provided.

In the laser device 30, the resonator is formed by a dichroic mirror 3, resonator mirrors 7, 8, and the semiconductor saturable absorber mirror 9. The resonator has, by way of example, a Z-type resonator structure whose resonator length is 1.5 m.

The resonator mirrors 7, 8 are each coated such that the curvature radius is 100 mm and the reflectivity thereof is 99.9% in regard to light having a wavelength in the range of 800 nm to 900 nm at the side of the concave surface thereof. The planar surface of each mirror at the side opposite to the concave surface is coated with anti-reflection coating such that the reflectivity is 0.1% or less in regard to light having a wavelength in the range of 800 nm to 900 nm.

The semiconductor saturable absorber mirror 9 functions as a mode-locking induced element for inducing mode-locking. For example, a semiconductor saturable absorber mirror having a modulation depth of 0.5% and a saturation fluence of 200 μJ/cm$^2$ (produced by BATOP GmbH) can be used.

The laser device 30 having the above-described structure is made to function as a mode-locking laser. For example, it is possible to obtain pulse light having a pulse width of 5 ps, an average output of 50 mW of all beams outputted from the resonator mirrors 7 and 8, a repetition frequency of 1000 MHz, and an oscillation wavelength of 820 nm.

Incidentally, a prism or a dispersion compensated element such as a dispersion compensated mirror may also be disposed in the above-described resonator of the laser device 30. Due to the structure as above, ultra-short pulse light of 1 ps or less can be obtained.

Fourth Embodiment

Next, a fourth embodiment of the present invention is described. Note that the same parts as those of each of the above-described embodiments should be denoted by the same reference numerals, respectively, and a detailed description thereof is omitted.

Figure 5:
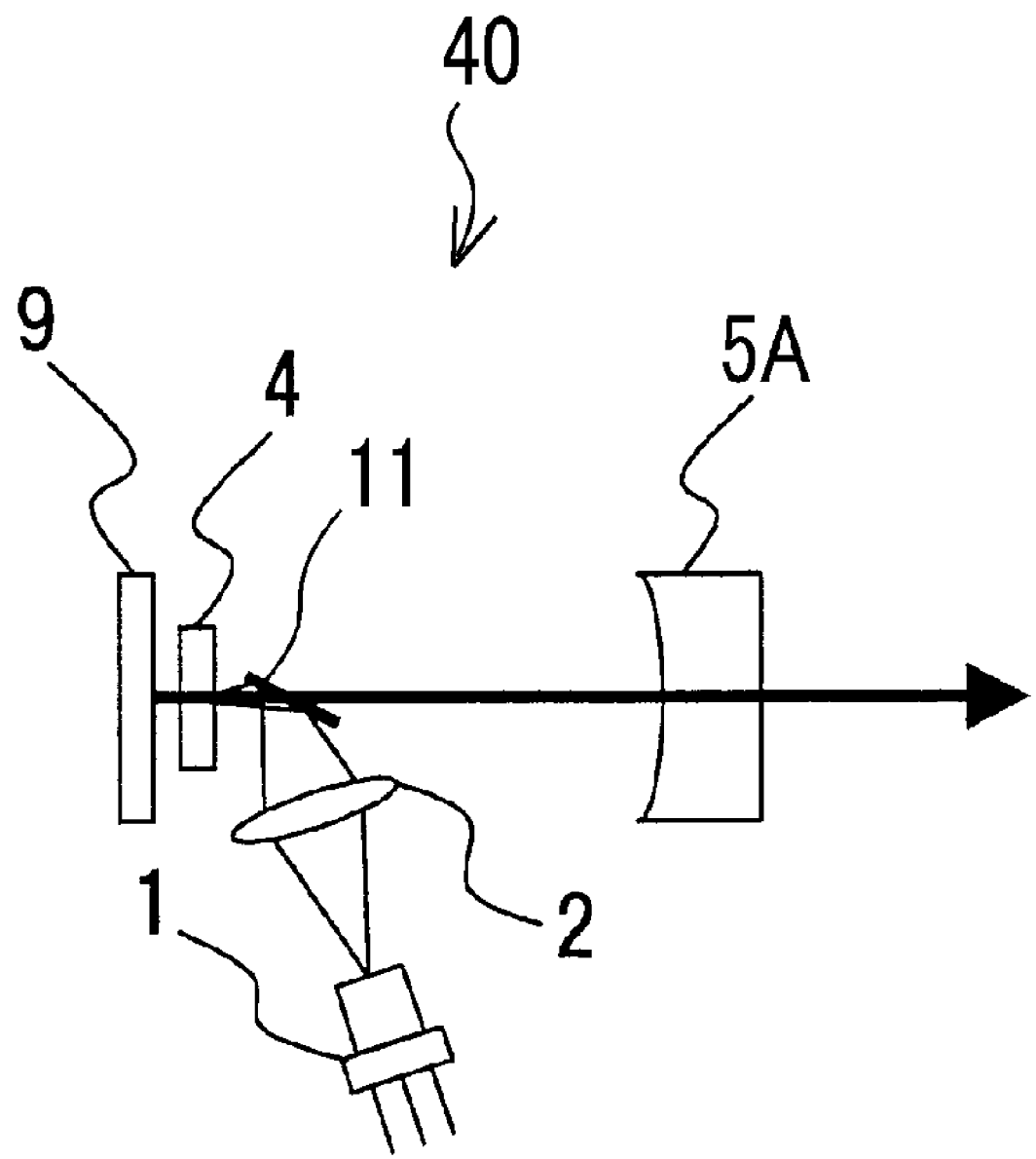
FIG. 5 is a schematic structural diagram of a laser device according to a fourth embodiment.

FIG. 5 shows the schematic structure of a laser device 40 according to the fourth embodiment. The laser device 40 is different from the laser device 10 shown in FIG. 2 in that in place of the dichroic mirror 3 and the output mirror 5, a semiconductor saturable absorber mirror 9, a dichroic mirror 11, and a dispersion compensated mirror 5A are provided.

In the laser device 40, a resonator is formed by the semiconductor saturable absorber mirror 9 and the dispersion compensated mirror 5A. Disposed in this resonator is the dichroic mirror 11 that is used to fold excitation light emitted from the GaN semiconductor laser 1 and the condensing lens 2 toward the solid laser medium 4.

The dispersion compensated mirror 5A has the same shape as that of the output mirror 5 shown in FIG. 2, and is coated with high-reflection coating having the amount of dispersion in the range of 0 to $-1500$ fs$^2$ and the reflectivity of 99% on the concave surface side thereof, and the planar surface side thereof at the side opposite to the concave surface is coated such that the reflectivity thereof is less than or equal to 0.2% in regard to light having a wavelength in the range of 800 nm to 900 nm.

The dichroic mirror 11 is disposed so as to have a Brewster's angle in regard to the optical axis of the resonator, and is coated with high-reflection coating having the reflectivity of 95% or more in regard to light having a wavelength of 445 nm ±5 nm and is also coated such that the reflectivity thereof is 0.2% or less in regard to light having a wavelength in the range of 800 nm to 900 nm on the end surface of the mirror at the side of the solid laser medium 4.

The dichroic mirror 11 as described above allows condensing of excitation of light at a short lens even in the resonator structure such as the laser device 40, thereby making it possible to simplify the exciting optical system.

Further, due to the laser device 40 having the above-described structure, an ultra-short pulse laser having a pulse width of 1 ps or less and a wavelength in the range of 800 to 900 nm, which laser is inexpensive and of a small size with the minimum number of parts required, can be formed.

Fifth Embodiment

Next, a fifth embodiment of the present invention is described. Note that the same parts as those of each of the aforementioned embodiments should be denoted by the same reference numerals, respectively, and a detailed description is omitted.

Figure 6:
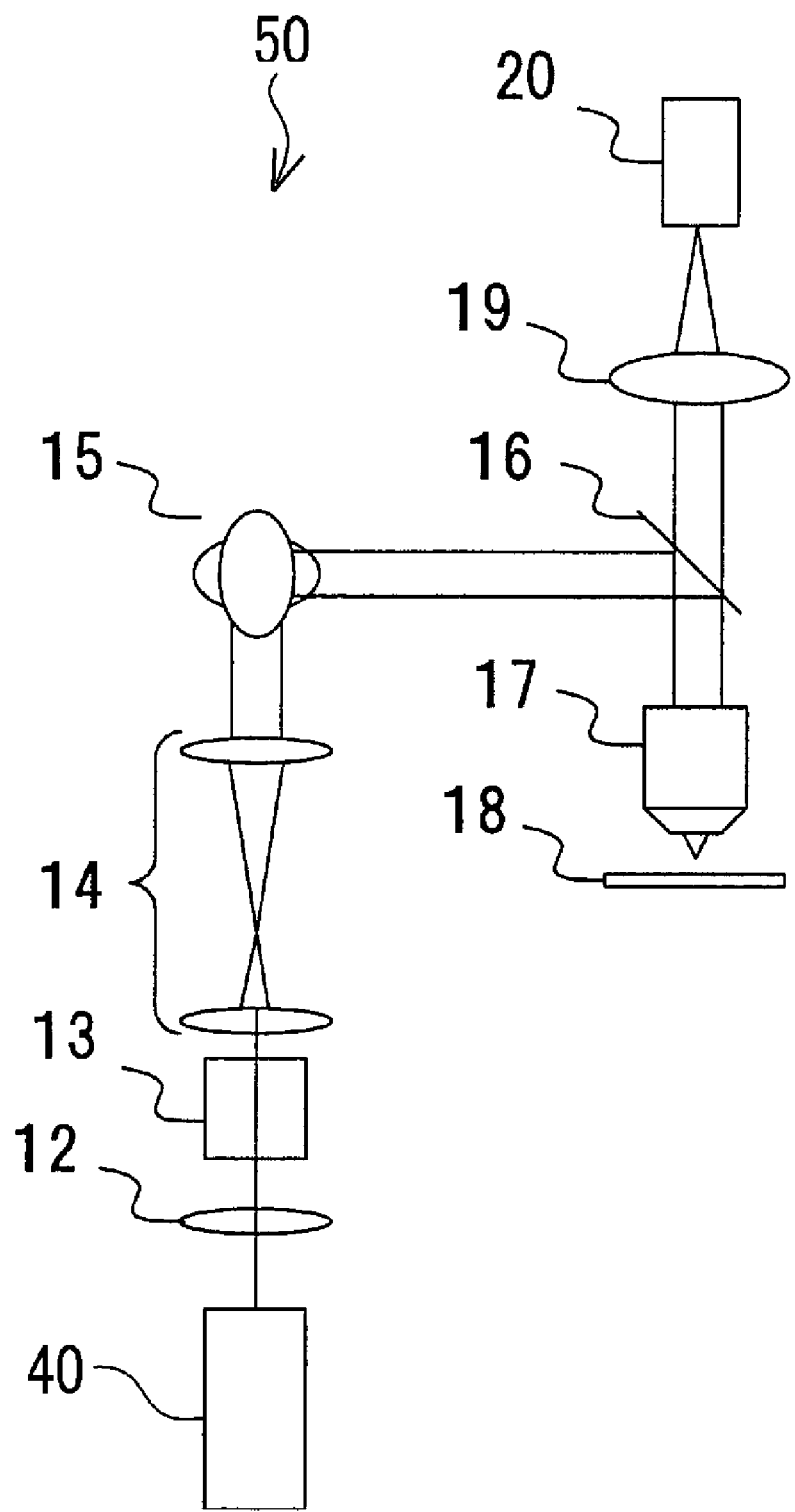
FIG. 6 is a schematic structural diagram of a multi-photon microscope device according to a fifth embodiment.

FIG. 6 shows the schematic structure of a multi-photon microscope device 50 according to the fifth embodiment. The multi-photon microscope device 50 is equipped with the laser device 40 explained in the fourth embodiment. Incidentally, the multi-photon microscope device 50 may be equipped with, in place of the laser device 40, the laser device 10, 20 or 30.

The laser light emitted from the laser device 40 is transmitted through a collimator lens 12, and thereafter, is adjusted by an output modulator 13 into an optimum output for acquirement of an image.

The output modulator 13 may be formed by a λ/2 plate and a light polarizer, or may be formed by a variable ND filter.

The laser light transmitted through the output modulator 13 is magnified by a beam magnification optical system 14 comprised of two pieces of lens such that the beam size would be made into approximately a pupil of an objective lens 17.

The laser light magnified by the beam magnification optical system 14 is reflected, toward the dichroic mirror 16, by a galvanometer mirror 15 that sweeps the focal point of the laser light in an in-plane direction. Then, the laser light reflected by the dichroic mirror 16 is condensed by the objective lens 17 and irradiated on a sample (an object to be measured) 18.

Fluorescence (return light) from the sample 18 passes through the objective lens 17 and the dichroic mirror 16, and thereafter, is condensed by the condensing lens 19 into photo multiplier tubes (PMTs) 20, and further detected.

Due to a light condensing spot being swept by the galvanometer mirror 15, and simultaneously fluorescence being acquired, detection of an image becomes possible. Further, due to an image being acquired by changing a stage having the sample set thereon in a depth-wise direction, a three-dimensional image can be acquired.

In a conventional multi-photon microscope, Ti:S is used as the light source, and therefore, the cost of the microscope device is high, for example, several tens-of-million yen, and the size of the device is also one optical (machine) platen or thereabouts.

To the contrary, using the low-cost and small-size laser device 40 explained in the fourth embodiment, an inexpensive and compact multi-photon microscope can be provided. Further, not only in the multi-photon microscope, but also in a nonlinear optical microscope such as an SHG microscope or a CARS microscope, a low-cost and small-size structure can be achieved by using the laser device 40.

In the laser device 30 explained in the third embodiment and also in the laser device 40 explained in the fourth embodiment, the case in which the semiconductor saturable absorber mirror 9 is used as the mode-locking induced element is described. However, ultra-short pulse light may also be generated as a resonator structure that may induce Kerr lens mode-locking that utilizes a non-linear refractive index based on the laser medium or the like.

Further, the structure for inducing mode-locking actively may be provided by locating a light modulating element such as an acoustic optical modulator (AOM) or an electric optical modulator (EOM), in a resonator.

Moreover, the structure for obtaining variable-wavelength ultra-short pulse light may also be provided by locating a wavelength control element such as an etalon element or a double-refraction filter in the laser devices 30, 40.

In each of the above-described embodiments, the structure using a high-output GaN semiconductor laser is used, and therefore, high-output laser light that could not be obtained by a conventional red semiconductor laser can be obtained.

Furthermore, in each of the above-described embodiments, the case in which the solid laser medium 4 (Cr:LiSAF) is excited with excitation light of 445 nm is described, but even in the cases of Cr:LiSGAF and Cr:LiCAF, efficient laser oscillation can be achieved by means of excitation of laser light having a wavelength in the range of 430 to 450 nm.

Further, in cases of using Cr:YGG ($Y_3Ga_5O_{12}$), Cr:YSGG ($K_3Sc_2Ga_3O_{12}$), Cr:GGG ($Gd_3Ga_5O_{12}$), Cr:GSGG ($Ga_3Sc_2Ga_3O_{12}$), Cr:GSAG ($Gd_3Sc_2Al_3O_{12}$), and Cr:LLGG ($La_3Lu_2Ga_3O_{12}$), efficient laser oscillation can be achieved by means of excitation with laser light having a wavelength in the range of 430 nm to 470 nm.

Moreover, alexandrite (Cr:BeAl$_2$O$_4$) is excited with excitation light having a wavelength in the range of 400 to 440 nm, whose light polarizing direction is parallel to the a axis, and is caused to oscillate oscillation light that is parallel to the b axis orthogonal to the a axis, thereby making it possible to allow efficient laser oscillation.

What is claimed is:

1. A laser device comprising:
    a resonator;

a solid laser medium that is disposed in the resonator and that outputs, as oscillation light, linear polarized light polarized in a direction parallel to a first crystal axis due to excitation light being made incident thereon; and an exciting unit that allows the excitation light to be made incident on the solid laser medium, which excitation light is linear polarized light having a wavelength in a blue region and is polarized in a direction intersecting the first crystal axis of the solid laser medium, wherein an absorption intensity of the excitation light in the solid laser medium in the direction in which the excitation light is polarized is larger than that of the excitation light in the direction parallel to the first crystal axis, and a light emission intensity in a predetermined oscillation wavelength region in regard to the direction parallel to the first crystal axis is larger than the light emission intensity in the direction in which the excitation light is polarized.

2. The laser device according to claim 1, wherein the direction in which the excitation light is polarized coincides with a direction parallel to a second crystal axis orthogonal to the first crystal axis of the solid laser medium, and the absorption intensity of the excitation light with respect to the direction parallel to the second crystal axis in the solid laser medium is the maximum value of the absorption intensity of the excitation light in each of the crystal axes.

3. The laser device according to claim 1, wherein the solid laser medium is a solid laser medium having a $Cr^{3+}$ ion added thereto.

4. The laser device according to claim 1, wherein the solid laser medium includes one selected from the group consisting of alexandrite ($Cr:BeAl_2O_4$), Cr:LiCAF ($LiCaAlF_6$), Cr:LiSAF ($LiSrAlF_6$), and Cr:LiSGAF ($LiSrGaF_6$).

5. The laser device according to claim 3, wherein the wavelength of the excitation light coincides with an excitation absorption wavelength from a $^4A_2$ normal level to a $^4T_1$ level.

6. The laser device according to claim 1, wherein the exciting unit comprises a semiconductor laser made from GaN.

7. The laser device according to claim 1, wherein a wavelength control element that controls an oscillation wavelength of the oscillation light is disposed in the resonator.

8. The laser device according to claim 1, wherein a mode-locking device for inducing mode-locking is disposed in the resonator.

9. The laser device according to claim 8, wherein the mode-locking device is a semiconductor saturable absorber mirror device.

10. A microscope comprising:

the laser device according to claim 1;

an optical system that condenses laser light from the laser device into an object to be measured, and applies the laser light to the object; and a detecting unit that condenses return light from the object to be measured, and detects the light.

* * * * *